US008802968B2

(12) United States Patent
Aruga

(10) Patent No.: US 8,802,968 B2
(45) Date of Patent: Aug. 12, 2014

(54) FLUORORESIN FILM AND ITS USE

(75) Inventor: Hiroshi Aruga, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 354 days.

(21) Appl. No.: 13/114,204

(22) Filed: May 24, 2011

(65) Prior Publication Data

US 2011/0220184 A1    Sep. 15, 2011

Related U.S. Application Data

(63) Continuation of application No. PCT/JP2009/070559, filed on Dec. 8, 2009.

(30) Foreign Application Priority Data

Dec. 8, 2008  (JP) ................................ 2008-312736

(51) Int. Cl.
*H01L 31/048* (2014.01)

(52) U.S. Cl.
USPC ........... 136/251; 428/145; 428/328; 428/331; 524/497

(58) Field of Classification Search
USPC .......................... 524/497; 428/145, 328, 331
See application file for complete search history.

(56) References Cited

U.S. PATENT DOCUMENTS

| | | | |
|---|---|---|---|
| 2003/0138637 A1* | 7/2003 | Aruga et al. .................. | 428/422 |
| 2007/0295244 A1 | 12/2007 | Himmelreich et al. | |
| 2009/0029176 A1 | 1/2009 | Nishida et al. | |
| 2010/0096772 A1 | 4/2010 | Okuya et al. | |

FOREIGN PATENT DOCUMENTS

| | | |
|---|---|---|
| CN | 1617356 A | 5/2005 |
| CN | 101177514 A | 5/2008 |
| EP | 2 040 306 A1 | 3/2009 |
| EP | 2 141 205 A1 | 1/2010 |
| JP | 1-212224 | 8/1989 |
| JP | 08-259731 | 8/1996 |
| JP | 2006-37090 | 2/2006 |
| JP | 2007193271 A * | 8/2007 |
| JP | 2008-53510 | 3/2008 |
| JP | 2008-85293 | 4/2008 |
| JP | 2008-227203 | 9/2008 |
| WO | 2007-088930 | 8/2007 |
| WO | WO 2007/148754 A1 | 12/2007 |
| WO | WO 2008/129901 A1 | 10/2008 |

OTHER PUBLICATIONS

Machine translation of JP 2007193271 A.*
Machine translation of JP H08-259731 A.*
U.S. Appl. No. 13/069,599, filed Mar. 23, 2011, Aruga.
Extended European Search Report issued Mar. 19, 2012, in Patent Application No. 09831907.2.
International Search Report issued Feb. 23, 2010 in PCT/JP09/070559 filed Feb. 5, 2010.
Office Action issued Jun. 7, 2013, in Chinese Patent Application No. 200980149346.5 (submitting English-language translation only, previously filed Jul. 19, 2013).
Combined Office Action and Search Report issued Jun. 7, 2013 in Chinese Patent Application No. 200980149346.5.

* cited by examiner

*Primary Examiner* — Ling Choi
*Assistant Examiner* — Wenwen Cai
(74) *Attorney, Agent, or Firm* — Oblon, Spivak, McClelland, Maier & Neustadt, L.L.P.

(57) ABSTRACT

A fluororesin film on which no bubble streaks are formed even when it contains a sufficient amount of titanium oxide, in which deterioration of the fluororesin is suppressed, and which has a low transmittance of ultraviolet light at a wavelength of at most 360 nm and has excellent weather resistance and heat resistance, a method of its use, a backsheet for a solar cell module, and a solar cell module. The fluororesin film may be used for an outermost layer of a backsheet of a solar cell module. The fluororesin film contains an ethylene/tetrafluoroethylene copolymer as the main component, and also contains specific titanium oxide composite particles. An arithmetic mean roughness Ra of the film surface to be in contact with the air is at most 3 μm. Further, a backsheet comprising a laminate having a fluororesin film, and a solar cell module comprising the backsheet.

21 Claims, 2 Drawing Sheets

FLUORORESIN FILM AND ITS USE

TECHNICAL FIELD

The present invention relates to a fluororesin film, a method of use of a fluororesin film, a backsheet for a solar cell module, and a solar cell module.

BACKGROUND ART

A solar cell is a semipermanent and pollution-free energy source which employs sunlight, whereas fossil fuel increases carbon dioxide in the air and greatly deteriorates the global environment. Accordingly, development of various solar cells as an important energy source in further is attempted. A solar cell is commonly used as a solar cell module having a solar cell element sealed by EVA (ethylene/vinyl acetate copolymer) and its front surface and rear surface sandwiched between a transparent glass substrate and a backsheet (rear side laminate).

A backsheet is provided to protect the EVA and the solar cell element, and a film to be used as the outermost layer (a film to be used on the side in contact with the air of a solar cell module, hereinafter referred to as "an outermost film") is required to have sufficient electrical insulation property (volume resistivity: at least $1 \times 10^{13}$ Ω·cm) and moisture-proof property (water vapor permeation at 40° C. under a relative humidity of 90% of at most 1 g/m$^2$·24 h).

Further, since a solar cell module is exposed to the outside for a long period of time, the outermost film of the backsheet is required to have sufficient weather resistance and heat resistance. Specifically, as the exposure by a carbon arc sunshine weather meter (SWM) for from 250 to 500 hours corresponds to the outdoor exposure for one year, the film is required to have such a property that the decrease in the strength by exposure by SWM for 5,000 hours (corresponding to 10 to 20 years) is suppressed to be at most half the initial strength (weather resistance). Further, since the temperature of a solar cell in practical use is at most at a level of 90° C., the film is required to have heat resistance to such an extent that the decrease in strength by use at 90° C. for 20 years is a practically acceptable level.

As the outermost film which has such properties, a fluororesin film using a fluororesin such as ETFE (ethylene/tetrafluoroethylene copolymer), PVF (polyvinyl fluoride) or PVdF (polyvinylidene fluoride) has been known. Among them, an ETFE film and a PVdF film are completely free from a decrease in the strength by hydrolysis even under conditions of 85° C. under a relative humidity of 85% for 1,000 hours. Further, an ETFE film is excellent in the moisture resistance and heat resistance, since the temperature at which the elongation is decreased to half by a heat resistance test for 100,000 hours (about ten years) is from about 150 to about 160° C.

Since an ETFE film is relatively flexible, when used for an outermost film, embossing is applied to the surface so that the gloss of the surface is suppressed and abrasions are not noticeable.

In recent years, the solar cell module is less likely to be installed in roof-integrated system, and is particularly often installed on the slant at an optimum angle so that the transparent glass substrate faces the sun depending on the latitude at the installation site. In such an installation method, a large quantity of reflected light of sunlight is applied to the backsheet at the rear side of the solar cell module, and thus the outermost film is required to have more excellent heat resistance and weather resistance.

Further, for the backsheet, employed is a method of laminating a fluororesin film and an aluminum foil or a moisture-proof plastic sheet to prevent water vapor from entering the solar cell module, since the water vapor permeation cannot sufficiently be suppressed only with a fluororesin film (outermost film). In such a case, with a view to protecting the plastic sheet and an adhesive to be used for lamination from sunlight, the fluororesin film is required to have a transmittance of ultraviolet rays at a wavelength of at most 360 nm of less than 1%. Further, reduction of the transmittance of ultraviolet light at a wavelength of at most 360 nm can be realized by dispersing a white pigment such as titanium oxide in the fluororesin film.

With respect to the improvement in the weather resistance of an ETFE film to be used for agricultural greenhouses and membrane structures, there is a technique to improve the weather resistance of the film by dispersing titanium oxide in an ETFE resin. However, since titanium oxide has photoactivity, the fluororesin is decomposed by the photoactivity when irradiated with light. Accordingly, a film has been proposed having titanium oxide covered with a large amount of silicon oxide or titanium oxide covered with cerium oxide to control the photoactivity, dispersed in an ETFE resin (Patent Document 1).

Patent Document 2 proposes a reduction of the difference ($\Delta_{300\text{-}100}$) in the Karl Fischer water content of titanium oxide covered with silicon oxide between at 300° C. and 100° C. to reduce the amount of bubbling water, so as to suppress formation of bubble streaks on a resin composition having titanium oxide incorporated, by water bubbling at the time of forming.

It is preferred to use, for an innermost film (a film on the side in contact with a filler such as EVA) in the backsheet, a film having a high solar reflectance in order that sunlight which leaks to the backsheet side through the solar cell element in the filler is reflected, and the reflected light is returned to the solar cell element again via the transparent glass substrate on the surface. Accordingly, it has been proposed to incorporate a white pigment such as titanium oxide in the innermost fluororesin film of the backsheet for the purpose of improving the solar reflectance (for example, Patent Documents 3 and 4). However, this proposal is for the innermost film of the backsheet, and heretofore, it has not been known to incorporate titanium oxide in the outermost film.

Patent Document 1: JP-A-8-259731
Patent Document 2: JP-A-2006-37090
Patent Document 3: JP-A-2008-085293
Patent Document 4: JP-A-2008-053510

DISCLOSURE OF INVENTION

Technical Problem

The film disclosed in Patent Document 1 is for agricultural greenhouses, membrane structures, etc., and is a film having a thickness of from 100 to 250 μm which is translucent or transparent through which at least 40% of visible rays are transmitted, and the concentration of titanium oxide contained in the film is less than 5 mass %. On the other hand, the outermost film of the backsheet is required to have thinness of at most 50 μm in view of economical efficiency. Further, the outermost film of the backsheet is required to have the weather resistance equal to or higher than that for a film for agricultural greenhouses, etc. and in addition, required to have blocking and shielding properties against ultraviolet light. Accordingly, in the case of the outermost film of the backsheet, it is necessary to disperse titanium oxide in a larger amount per unit volume. However, it was found that if titanium oxide in a large amount required for the outermost film of the backsheet is covered with silicon oxide and contained in a large amount in the film, bubble streaks are likely to form by bubbling of water contained in the cover layer comprising silicon oxide.

Accordingly, as disclosed in Patent Document 2, it has been studied to disperse titanium oxide covered with silicon oxide, of which the difference ($\Delta_{300\text{-}100}$) in the Karl Fischer water content between at 300° C. and at 100° C., in the fluororesin film as the outermost film. It was found that although formation of bubble streaks can be suppressed by such a method, no sufficient weather resistance of the fluororesin film can be obtained.

From the above reasons, it was found that by conventional techniques, it is difficult to achieve absence of bubble streaks on the film, suppression of deterioration of the fluororesin forming the film, and incorporation of titanium oxide in a sufficient amount, for the outermost film of the backsheet.

Accordingly, it is an object of the present invention to provide a fluororesin film on which no bubble streaks are formed even if titanium oxide in a sufficient amount is incorporated, of which deterioration of the fluororesin is suppressed, and which has a low transmittance of ultraviolet light at a wavelength of at most 360 nm and has excellent heat resistance and weather resistance, as a film for a backsheet of a solar cell module.

Further, it is an object of the present invention to provide a method of use of a fluororesin film on which no bubble streaks are formed even if titanium oxide in a sufficient amount is contained, of which deterioration of the fluororesin is suppressed, and which has a low transmittance of ultraviolet light at a wavelength of at most 360 nm and has excellent heat resistance and weather resistance.

Still further, the present invention provides a backsheet for a solar cell module which has excellent heat resistance and weather resistance and which can protect a solar cell module stably over a long period of time, and a solar cell module equipped with such a backsheet.

Solution to Problem

The fluororesin film of the present invention is a fluororesin film containing an ethylene/tetrafluoroethylene copolymer as the main component, to be used for an outermost layer of a backsheet of a solar cell module, which contains the following titanium oxide composite particles and has an arithmetic mean roughness Ra as stipulated by JIS B0601 of the film surface to be in contact with the air of at most 3 µm:

titanium oxide composite particles: titanium oxide composite particles obtained by subjecting silica-covered titanium oxide particles comprising titanium oxide particles and a silica cover layer formed on their surface, to hydrophobization treatment by a hydrophobizing agent, which satisfy the following (a) to (c):

(a) in the silica-covered titanium oxide particles, the amount of the silica cover layer as calculated as $SiO_2$ is from 1.5 to 5 parts by mass per 100 parts by mass of the titanium oxide particles;

(b) in the silica-covered titanium oxide particles, the difference ($\Delta_{300\text{-}100}$) in the Karl Fischer water content between at 300° C. and at 100° C. is at most 0.5%; and (c) in the titanium oxide composite particles, the amount of the hydrophobizing agent is from 0.5 to 10 parts by mass per 100 parts by mass of the silica-covered titanium oxide particles.

Further, in the fluororesin film of the present invention, the content of the titanium oxide composite particles is preferably from 6 to 25 mass %.

Further, the average particle size of the titanium oxide composite particles is preferably from 0.1 to 0.4 µm.

Further, the acid-solubility of the titanium oxide composite particles is preferably from 15 to 50%.

Further, the hydrophobizing agent is preferably a silane coupling agent (S1) having an alkyl group or a silicone compound (S2).

Further, the fluororesin film of the present invention preferably has a thickness of from 12 to 100 µm.

Further, the above arithmetic mean roughness Ra is preferably from 0.5 to 2.5 µm.

Further, it preferably contains a copper compound in an amount of from 5 to 500 ppm.

The backsheet for a solar cell module of the present invention is a backsheet comprising a laminate having the fluororesin film as defined in any one of the above as the outermost layer.

Further, the solar cell module of the present invention comprises a transparent substrate, a filler layer having a solar cell element sealed therein and the above backsheet in this order.

Further, the method of use of a fluororesin film of the present invention is a method which uses a fluororesin film containing an ethylene/tetrafluoroethylene copolymer as the main component, containing the following titanium oxide composite particles and having an arithmetic mean roughness Ra as stipulated by JIS B0601 of at least one film surface of at most 3 µm, as an outermost layer of a backsheet of a solar cell module so that the above film surface is in contact with the air:

titanium oxide composite particles: titanium oxide composite particles obtained by subjecting silica-covered titanium oxide particles comprising titanium oxide particles and a silica cover layer formed on their surface, to hydrophobization treatment by a hydrophobizing agent, which satisfy the following (a) to (c):

(a) in the silica-covered titanium oxide particles, the amount of the silica cover layer as calculated as $SiO_2$ is from 1.5 to 5 parts by mass per 100 parts by mass of the titanium oxide particles;

(b) in the silica-covered titanium oxide particles, the difference ($\Delta_{300\text{-}100}$) in the Karl Fischer water content between at 300° C. and at 100° C. is at most 0.5%; and (c) in the titanium oxide composite particles, the amount of the hydrophobizing agent is from 0.5 to 10 parts by mass per 100 parts by mass of the silica-covered titanium oxide particles.

Advantageous Effects of Invention

The fluororesin film of the present invention is a film for a backsheet of a solar cell module, and even if titanium oxide in a sufficient amount is contained, no bubble streaks will be formed on the film, and deterioration of the fluororesin is suppressed. Further, it has a low transmittance of ultraviolet light at a wavelength of at most 360 nm, and has excellent heat resistance and weather resistance.

Further, according to the method of use of the present invention, a fluororesin film on which no bubble streaks will be formed even if titanium oxide in a sufficient amount is contained, of which deterioration of the fluororesin is suppressed, and which has a low transmittance of ultraviolet light at a wavelength of at most 360 nm and has excellent heat resistance and weather resistance, is used for a backsheet for a solar cell module, whereby the solar cell module can be protected stably over a long period of time.

Further, the backsheet for a solar cell module of the present invention has excellent heat resistance and weather resistance by use of the above fluororesin film. Thus, it can protect a solar cell module stably over a long period of time.

Further, the solar cell module of the present invention can be used stably over a long period of time.

DESCRIPTION OF EMBODIMENTS

[Fluororesin Film]

Figure 1:
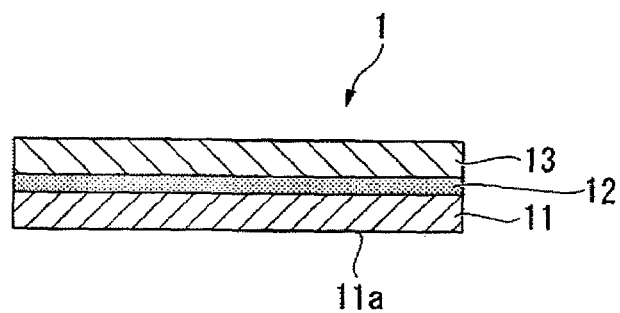
FIG. 1 is a cross sectional view illustrating one embodiment of the backsheet for a solar cell module of the present invention.

The fluororesin film of the present invention is a film to be used for the outermost layer of a backsheet of a solar cell module. Further, the fluororesin film of the present invention is a film containing an ethylene/tetrafluoroethylene copolymer (ETFE) as the main component, and contains titanium oxide composite particles obtained by subjecting silica-covered titanium oxide particles comprising titanium oxide particles and a silica cover layer formed on their surface, to hydrophobization treatment by a hydrophobizing agent. Further, the arithmetic mean roughness Ra as stipulated by JIS B0601 of the film surface to be in contact with the air is at most 3 μm.

In the fluororesin film containing ETFE as the main component, the mass ratio of ETFE per 100 mass % of the entire resin constituting the film is preferably at least 90 mass %, more preferably at least 98 mass %, particularly preferably 100 mass %.

(Ethylene/Tetrafluoroethylene Copolymer)

ETFE has repeating units based on tetrafluoroethylene (hereinafter referred to as "TFE") and repeating units based on ethylene. The molar ratio of them (TFE/ethylene) is preferably from 20/80 to 80/20, more preferably from 30/70 to 70/30, further preferably from 40/60 to 60/40.

ETFE may contain, in addition to the repeating units based on TFE and ethylene, repeating units based on another monomer.

Such another monomer may, for example, be a fluoroethylene (excluding TFE) such as $CF_2=CFCl$ or $CF_2=CH_2$; a $C_{3-5}$ perfluoroolefin such as hexafluoropropylene (HFP) or octafluorobutene-1; a polyfluoroalkylethylene represented by $X(CF_2)_nCY=CH_2$ (wherein each of X and Y is a hydrogen atom or a fluorine atom, and n is an integer of from 2 to 8); a perfluorovinyl ether represented by $R^f(OCFXCF_2)_m$ $OCF=CF_2$ (wherein $R^f$ is a $C_{1-6}$ perfluoroalkyl group, X is a fluorine atom or a trifluoromethyl group, and m is an integer of from 0 to 5); a perfluorovinyl ether having a group capable of easily converted to a carboxylic acid group or a sulfonic acid group, such as $CH_3C(=O)CF_2CF_2CF_2OCF=CF_2$ or $FSO_2CF_2CF_2OCF(CF_3)CF_2OCF=CF_2$; a perfluorovinyl ether having an unsaturated bond such as $CF_2=CFOCF_2CF=CF_2$ or $CF_2=CFO(CF_2)_2CF=CF_2$; a fluoromonomer having an alicyclic structure such as perfluoro(2,2-dimethyl-1,3-dioxol) (PDD), 2,2,4-trifluoro-5-trifluoromethoxy-1,3-dioxol or perfluoro(2-methylene-4-methyl-1,3-dioxolane); or an olefin (excluding ethylene) such as a C3 olefin (such as propylene) or a C4 olefin (such as butylene or isobutylene).

In the polyfluoroalkylethylene represented by $X(CF_2)_n$ $CY=CH_2$, n is preferably from 2 to 6, more preferably from 2 to 4. Its specific examples include $CF_3CF_2CH=CH_2$, $CF_3CF_2CF_2CF_2CH=CH_2$, $CF_3CF_2CF_2CF_2CF=CH_2$, $CF_2HCF_2CF_2CF=CH_2$ and $CF_2HCF_2CF_2CF=CH_2$.

Specific examples of the perfluorovinyl ether such as $R^f(OCFXCF_2)_mOCF=CF_2$, include perfluoro(methyl vinyl ether), perfluoro(ethyl vinyl ether) (PEVE), perfluoro(propyl vinyl ether) (PPVE), $CF_2=CFOCF_2CF(CF_3)O(CF_2)_2CF_3$, $CF_2=CFO(CF_2)_3O(CF_2)_2CF_3$, $CF_2=CFO(CF_2CF(CF_3)O)_2(CF_2)_2CF_3$ and $CF_2=CFOCF_2CF(CF_3)O(CF_2)_2CF_3$.

Another monomer in ETFE is preferably the above polyfluoroalkylethylene, HFP or PPVE, more preferably HFP, PPVE, $CF_3CF_2CH=CH_2$ or $CF_3(CF_2)_3CH_2=CH$.

Such other monomers may be used alone or in combination of two or more.

The proportion of repeating units based on such another monomer is preferably at most 10 mol %, more preferably at most 6 mol %, further preferably at most 3 mol % based on all the repeating units (100 mol %) in ETFE.

The number average molecular weight of ETFE is not particularly limited, and is preferably from 100,000 to 500,000, more preferably from 200,000 to 400,000. When the number average molecular weight of ETFE is at least 100,000, the strength will hardly be decreased in the heat resistance test. Further, when the number average molecular weight of ETFE is at most 500,000, formation of a thin film at a level of 10 μm will be easy.

A polymer which can be added to ETFE may, for example, be a vinyl fluoride polymer, a vinylidene fluoride polymer, a vinylidene fluoride/hexafluoropropylene copolymer, a tetrafluoroethylene/hexafluoropropylene/vinylidene fluoride copolymer, a tetrafluoroethylene/propylene copolymer, a tetrafluoroethylene/vinylidene fluoride/propylene copolymer, a hexafluoropropylene/tetrafluoroethylene copolymer, or a perfluoro(alkyl vinyl ether)/tetrafluoroethylene copolymer.

(Titanium Oxide Composite Particles)

Titanium oxide composite particles are particles obtained by further subjecting silica-covered titanium oxide particles comprising titanium oxide particles and a silica cover layer formed on their surface, to hydrophobization treatment by a hydrophobizing agent. Titanium oxide has a high refractive index of visible light, is more excellent in chemical resistance than a white pigment such as calcium carbonate, zinc oxide or barium sulfate, is fast, and can improve the weather resistance of the fluororesin film.

The crystalline form of the titanium oxide particles is preferably a rutile-form which is considered to have lower photoactivity. Further, titanium oxide particles obtained by a sulfate method of hydrolyzing a titanium sulfate solution or by a chloride method of subjecting titanium halide to gas phase oxidation may also be used.

Although titanium oxide particles are fast as described above, they have photoactivity, and thus they decompose the fluororesin film by irradiation with light. Accordingly, the titanium oxide particles are used in a state where their photoactivity is suppressed by forming a silica cover layer on the surface of the titanium oxide particles. The silica cover layer preferably comprises silicon dioxide or its hydrate.

In the silica-covered titanium oxide particles, the amount of the silica cover layer as calculated as $SiO_2$ is from 1.5 to 5 parts by mass, preferably from 2 to 5 parts by mass per 100 parts by mass of the titanium oxide particles. When the above mass ratio of the silica cover layer is at least 1.5 parts by mass, the photoactivity of the titanium oxide composite particles can sufficiently be reduced. Further, when the above mass ratio of the silica cover layer is at most 5 parts by mass, it is possible to prevent bubbling of water contained in the silica cover layer at the time of film formation, which leads to formation of bubble streaks on the surface of the obtainable fluororesin film, thus leading to failure in the appearance.

Since the ETFE resin has a high melting temperature of 300° C. or higher, processing at high temperature is required when the titanium oxide composite particles are incorporated in the fluororesin. However, the titanium oxide particles are highly hydrophilic and has high moisture absorptivity in nature, and thus when processed at high temperature, the water content which has been absorbed in and is vaporized from the titanium oxide particles is vaporized and forms bubble streaks at the time of the film formation, thus leading to failure in the appearance. Further, since the silica cover layer also has moisture absorptivity, if the water contained in the silica cover layer is large, the water will bubble at the time of the film formation to cause failure in the outer appearance, in the same manner as the titanium oxide particles.

From the above reasons, with respect to the silica-covered titanium oxide particles in the present invention, the difference in the Karl Fischer water content ($\Delta_{300-100}$) between at 300° C. and at 100° C. (hereinafter simply referred to as "water content difference ($\Delta_{300-100}$)") is at most 0.5%, preferably at most 0.3%. When the water content difference ($\Delta_{300-100}$) is at most 0.5%, it is possible to prevent bubbling of water absorbed in the silica cover layer at the time of formation, thus leading to failure in the outer appearance of the fluororesin film. Further, when the water content difference ($\Delta_{300-100}$) is at least 0.1%, the productivity of the titanium oxide composite particles will be improved. In the present invention, the Karl Fischer water content is based on the mass %.

The silica cover layer is preferably a dense layer so as to suppress the photoactivity of titanium oxide particles thereby to obtain excellent weather resistance of the film. The denseness of the silica cover layer can be confirmed by measuring the following acid-solubility (unit: %) for neutralization of the silica-covered titanium oxide particles.

0.2 g of a sample (silica-covered titanium oxide particles) is added in 10 ml of 98% sulfuric acid, ultrasonic waves are applied thereto for one minute for dispersion, and the dispersion is heated at 180° C. for one hour. Then, the sample was subjected to solid-liquid separation from sulfuric acid by a centrifugal separator, the amount of titanium oxide (as calculated as $TiO_2$) in sulfuric acid is measured by colorimetry, and the acid-solubility is calculated from the measured value in accordance with the following formula:

Acid-solubility (%)=(amount (g) of titanium oxide in sulfuric acid/0.2 (g))×100

The lower the acid-solubility, the denser the silica cover layer and the more excellent weather resistance is to be obtained, and it is preferably from 15 to 50%, more preferably from 15 to 30%.

With respect to the titanium oxide composite particles in the present invention, the silica-covered titanium oxide particles are more preferably further subjected to hydrophobization treatment by a hydrophobizing agent. By subjecting the particles to hydrophobization treatment by a hydrophobizing agent, the dispersibility of the particles in the fluororesin will be improved. As a result, it is possible to prevent agglomeration of particles, thus leading to discoloration of the fluororesin, or formation of a hole in the film.

The hydrophobizing agent is preferably a silane coupling agent (S1) having an alkyl group or a silicone compound (S2). Further, in a case where the silane coupling agent (S1) is used, curing of the fluororesin film is likely to advance when exposed to the outside over a long period of time, as compared with a case where it is not used. Whereas, in a case where the silicone compound (S2) is used, curing of the fluororesin film hardly advances even by exposure to the outside over a long period of time, and the flexibility is likely to be maintained. The hydrophobizing agent is more preferably the silicone compound (S2) to the silane coupling agent (S1). Although the reason is not clearly understood, the silicone compound is estimated to have an effect of suppressing crystallization of a fluororesin.

The silane coupling agent (S1) may, for example, be a trialkoxysilane such as isobutyltrimethoxysilane, hexyltrimethoxysilane or (3,3,3-trifluoropropyl)trimethoxysilane; a silazane such as hexamethyldisilazane, or a chlorosilane such as dimethyldichlorosilane. Among them, isobutyltrimethoxysilane is preferred.

The silicone compound (S2) is an organopolysiloxane having an organic group. The organic group is preferably an alkyl group having at most 4 carbon atoms or a phenyl group. One which is commonly called a silicone oil may be used.

The silicone oil may, for example, be a straight silicone oil such as dimethyl silicone oil or phenyl methyl silicone oil; an alkyl-modified silicone oil, an alkyl aralkyl-modified silicone oil or a fluorinated alkyl-modified silicone oil. Among them, dimethyl silicone oil is preferred in view of the cost, and phenyl methyl silicone oil is preferred in view of the heat resistance.

Further, the molecular weight of the silicone oil is preferably at most 1,500 in order that an oxygen functional group of e.g. silicon oxide in the silica cover layer of the silica-covered titanium oxide particles and the silicone oil are reacted with high efficiency to form a uniform and dense treated coating film thereby to achieve more favorable dispersibility in the fluororesin.

As the silicone compound (S2), commercially available products may be used. As the dimethyl silicone oil, SH200 (tradename) manufactured by Dow Corning Toray Co., Ltd., KF96 (tradename) manufactured by Shin-Etsu Chemical Co., Ltd., and TSF451 (tradenames) manufactured by Toshiba Silicones, having various molecular weights (viscosities), may, for example, be mentioned. Further, as the phenyl methyl silicone oil, SH510 (tradename), SH550 (tradename) and SH710 (tradename) manufactured by Dow Corning Toray Co., Ltd. may, for example, be mentioned.

In the titanium oxide composite particles, the amount treated by the hydrophobizing agent is from 0.5 to 10 parts by mass, preferably from 1 to 5 parts by mass per 100 parts by mass of the silica-covered titanium oxide. When the above amount treated by the hydrophobizing agent is at least 0.5 part by mass, coloring of the fluororesin can be prevented. Further, when the above amount treated by the hydrophobizing agent is at most 10 parts by mass, it is possible to prevent formation of bubble streaks on the fluororesin film by the influence of thermal decomposition of the hydrophobizing agent, thus leading to deterioration of the film outer appearance.

The average particle size of the titanium oxide composite particles is preferably from 0.1 to 0.4 μm, more preferably from 0.15 to 0.30 μm. The average particle size of the titanium oxide composite particles in the present invention is a value obtained by measuring particle sizes of a plurality of titanium oxide composite particles selected at random by an electron microscope and averaging the measured particle sizes. If the average particle size of the titanium oxide composite particles is less than 0.1 μm, since the specific surface area of the titanium oxide particles is large, the silica cover layer to suppress the photoactivity is required in an amount of at least 15 mass % based on the entire titanium oxide composite particles, and it is thereby difficult to prepare silica-covered titanium oxide having the water content suppressed low. Further, if the average particle size of the titanium oxide composite particles exceeds 0.4 μm, when such titanium oxide composite particles are contained at a concentration exceeding 6 mass % to form a fluororesin film having a thickness of at most 25 μm, the film may have a hole.

The content of the titanium oxide composite particles in the fluororesin film (100 mass %) is preferably from 6 to 25 mass %, more preferably from 8 to 25 mass %. When the content of the titanium oxide composite particles is at least 6 mass %, most of the ultraviolet light is absorbed in the titanium oxide composite particles in the vicinity of the surface layer of the fluororesin film and are blocked out, and thus they hardly enter the interior of the film, and accordingly it is likely to prevent the ultraviolet light from reaching the whole film to develop the initial phenomenon of the photoactivity. The initial phenomenon of the photoactivity is a whitening phenomenon such that the surface will be whiter. If the initial phenomenon of the photoactivity occurs, the binding power of the fluororesin will be decreased and the titanium oxide composite particles will move to the outer layer, and accordingly a decrease in the ultraviolet transmittance and an increase in the solar reflectance of the fluororesin film are induced without a decrease in the mechanical strength. For the backsheet of a solar cell, a low ultraviolet transmittance and a high solar reflectance of the fluororesin film (outermost film) are preferred. Further, in view of e.g. good appearance, the values of the ultraviolet transmittance and the solar reflectance are preferably not changed during the use. Further, when the content of the titanium oxide composite particles is at most 25 mass %, the titanium oxide composite particles are likely to be dispersed in the fluororesin film.

In the fluororesin film of the present invention, additives other than the titanium oxide composite particles may be contained.

Such additives may be a copper compound such as copper oxide or copper iodide. By incorporating the copper compound, heat resistance of the obtainable fluororesin film will be improved. The particle size of the copper compound is preferably from 1 to 50 μm.

The content of the copper compound in the fluororesin film is preferably from $1\times10^{-4}$ to $5\times10^{-2}$ part by mass (from 1 to 500 ppm), more preferably from $5\times10^{-4}$ to $3\times10^{-2}$ part by mass (from 5 to 300 ppm), most preferably from $1\times10^{-3}$ to $2\times10^{-2}$ part by mass (from 10 to 200 ppm), per 100 parts by mass of ETFE. When the content of the copper compound is at least 1 ppm, the heat resistance of the fluororesin film will easily be improved. Further, when the content of the copper compound is at most 500 ppm, a decrease in electrical properties such as the insulation resistance of the fluororesin film is likely to be suppressed.

With respect to the titanium oxide composite particles to be contained in the fluororesin film of the present invention, as described above, the photoactivity of titanium oxide is suppressed by forming the silica cover layer, and formation of bubble streaks by bubbling of water at the time of formation can be suppressed by bringing the water content difference ($\Delta_{300-100}$) of the silica cover layer to be at most 0.5%.

According to studies by the present inventor, it was found that the effect of suppressing the photoactivity of titanium oxide cannot sufficiently be maintained, and excellent weather resistance cannot be obtained only by satisfying these two requirements. As a result of further studies, it was found that the weather resistance being insufficient is because of the following reasons. That is, to the outermost film of a backsheet, embossing is applied in order that abrasions on the surface are not noticeable and that the regular reflection of the sunlight on the film surface is suppressed. However, if the surface (the surface to be in contact with the air) of the fluororesin film to be the outermost film is too rough, fine cracks will form on the film surface, and the titanium oxide composite particles exposed to the crack portion are influenced by the water, whereby probability of development of the photoactivity of titanium oxide will be high. Accordingly, in the present invention, the relation between the roughness of the film surface and the effect of maintaining the reduction in the photoactivity of titanium oxide is examined and as a result, it was found that the effect of suppressing the photoactivity of titanium oxide by formation of the silica cover layer can sufficiently be maintained when the roughness of the film surface satisfies specific conditions.

With respect to the fluororesin film of the present invention, the arithmetic mean roughness Ra as stipulated by JIS B0601 (hereinafter simply referred to as "arithmetic mean roughness Ra") of the film surface to be in contact with the air is at most 3 μm, preferably from 0.5 to 3 μm, more preferably from 0.5 to 2.5 μm, most preferably from 0.6 to 1.2 μm.

By embossing to be applied to a fluororesin film of white PVF (polyvinyl fluoride) or PVdF (polyvinylidene fluoride) which has been used for the outermost film of a backsheet, the arithmetic mean roughness Ra of the outermost film is from 0.1 to 0.4 μm. The reason of small Ra is that the fluororesin itself of white PVF or PVdF is poor in elongation and thus embossing is hardly applied thereto, and that the fluororesin itself is hard and scars are hardly noticeable, and accordingly Ra to such a level is applied.

With respect to ETFE, by the arithmetic mean roughness Ra of the film surface to be in contact with the air being from 0.5 to 3 μm, formation of fine cracks is suppressed, and development of the photoactivity of titanium oxide by the influence of water which infiltrates into the cracks is prevented. Further, when the arithmetic mean roughness Ra is at least 0.5 μm, even if scars are formed on the film surface, the scars are hardly noticeable. Further, when the arithmetic mean roughness Ra is at most 3.0 μm, formation of fine cracks on the film is likely to be suppressed.

The arithmetic mean roughness Ra can be measured, for example, by a contact surface roughness meter (manufactured by Kosaka Laboratory Ltd., SURFCORDER SE-30H).

With respect to the fluororesin film of the present invention, one surface (the surface to be in contact with the air) of the film has to satisfy the above requirement of the arithmetic mean roughness Ra, and the arithmetic mean roughness Ra of both surfaces of the film may be at most 3 μm.

With respect to the fluororesin film of the present invention, the product of the water content difference ($\Delta_{300-100}$) (%) of the silica-covered titanium oxide particles and the content (mass %) of the titanium oxide composite particles in the fluororesin film is preferably at most 10. For example, in the case of a fluororesin film containing 25 mass % of the titanium oxide composite particles, when the water content difference ($\Delta_{300-100}$) is at most 0.4%, the amount of the titanium oxide composite particles can be increased in a state where the total water content generated from the titanium oxide composite particles at the time of formation of the fluororesin film is suppressed to be lower, and accordingly it is likely to satisfy both excellent weather resistance and the film outer appearance.

The thickness of the fluororesin film is preferably from 12 to 100 μm, more preferably from 20 to 50 μm. When the thickness of the fluororesin film is at least 12 μm, the fluororesin film hardly has a hole even when it contains the titanium oxide composite particles. Further, when the thickness of the fluororesin film is at most 100 μm, such a fluororesin film is easily produced at low cost.

In the fluororesin film of the present invention, a preferred content of the titanium oxide composite particles is from 6 to 25 parts by mass per 100 parts by mass of the fluororesin. When the titanium oxide composite particles in such an amount are contained, the transmittance of ultraviolet light at a wavelength of at most 360 nm is easily controlled to be at most 0.1%. To protect an adhesive and a moisture-proof plastic sheet of the backsheet, the transmittance of ultraviolet light at a wavelength of at most 360 nm through the outermost film is preferably less than 1%. According to the fluororesin film of the present invention, the above adhesive and moisture-proof plastic sheet can sufficiently be protected.

With respect to the electrical insulation property, no high insulation property is required for a thin fluororesin film by itself. However, a significant change in the volume resistivity between before and after the weather resistance test or the heat resistance test is unfavorable, and a film with a change in the value by at least 10 times cannot usually be employed for a backsheet for a solar cell. The fluororesin film of the present invention has sufficient electrical insulation property of at least $1 \times 10^{13}$ Ω·cm, and the value does not significantly change even after the weather resistance test or the heat resistance test.

(Production Process)

Now, one example of the process for producing the fluororesin film of the present invention will be described.

As a method of forming a silica cover layer on the surface of titanium oxide particles, a method disclosed in e.g. JP-A-53-33228 or JP-A-2006-37090 may be employed. For example, the following method may be mentioned.

First, titanium oxide particles are dispersed in water to obtain an aqueous slurry. To obtain the aqueous slurry, a wet pulverizer such as a ball mill may be used. Further, it is preferred to adjust the pH of the aqueous slurry to be at least 9, so as to disperse the titanium oxide particles stably in water. To adjust the pH, a basic compound such as a hydroxide, a carbonate or an ammonium salt of an alkali metal or an alkaline earth metal may be used. Among them, sodium hydroxide is industrially preferred. Further, for the purpose of improving the dispersibility of titanium oxide particles, a dispersing agent such as a silicate compound such a sodium silicate or potassium silicate may be used in combination.

The solid content concentration of the titanium oxide particles in the aqueous slurry is preferably from 50 to 300 g/l, more preferably from 100 to 200 g/l. When the solid content concentration of the titanium oxide particles is at least 50 g/l, industrial operation properties will be more improved. Further, when the solid content concentration of the titanium oxide particles is at most 300 g/l, the viscosity of the aqueous slurry being too high will easily be suppressed, and a dense and uniform silica cover layer will easily be obtained.

Then, in the prepared aqueous slurry of the titanium oxide particles, a silicate is neutralized by an acidic compound over a period of at least 30 minutes to obtain silica-covered titanium oxide particles comprising the titanium oxide particles and a silica cover layer formed on their surface. By carrying out neutralization over a period of at least 30 minutes, the water content difference ($\Delta_{300-100}$) of the silica-covered titanium oxide particles can be brought to be at most 0.5%.

Further, the neutralization time is preferably at least 1 hour with a view to making the water content difference ($\Delta_{300-100}$) smaller.

Further, the pH at the time of neutralization is preferably from 4 to 7.5, more preferably from 4.5 to 7, in order that a dense silica cover layer with a small water content difference ($\Delta_{300-100}$) can easily be formed. Further, the temperature of the aqueous slurry at the time of neutralization is preferably from 80 to 95° C., more preferably from 90 to 95° C., in order that a dense silica cover layer with a small water content difference ($\Delta_{300-100}$) will easily be formed.

Further, the water content difference ($\Delta_{300-100}$) of the silica-covered titanium oxide particles can further be reduced by firing the silica-covered titanium oxide particles at 300° C. or higher after formation of the silica cover layer. Further, the firing is carried out preferably at a temperature of at most 500° C. so as to prevent degeneration of the silica-covered titanium oxide particles.

As the silicate, sodium silicate or potassium silicate may, for example, be used. Further, as the acidic compound, an inorganic acid such as sulfuric acid or hydrochloric acid or an organic acid such as acetic acid or formic acid may, for example, be used.

For the hydrophobization treatment of the silica-covered titanium oxide particles by a hydrophobizing agent, a method (1) of preliminarily carrying out the hydrophobization treatment before the silica-covered titanium oxide particles are dispersed and kneaded in the fluororesin may be employed, and a method (1) of carrying out the silica-covered titanium oxide particles and the fluororesin is employed. Some of the hydrophobizing agents are ones which are selectively disposed at the interface of the fluororesin and the silica-covered titanium oxide only by mixing, represented by a silicone oil. In the case of such a hydrophobizing agent, a method (2) may be employed wherein in a step of mixing materials before kneading, the hydrophobizing agent is incorporated at the same time together with the silica-covered titanium oxide and the fluororesin for hydrophobization.

In the method (1), in the case of the silane coupling agent (S1), for example, a method (wet treatment method) may be employed wherein a required amount of the silane coupling agent (S1) is dissolved in a solvent such as an alcohol such as isopropyl alcohol, toluene or hexane, and then the silica-covered titanium oxide particles are dispersed in the solvent so that the hydrophobizing agent is adsorbed in and reacted with their surface, and the solvent is evaporated at a temperature of about 100° C., followed by baking at from 140° C. to 170° C. Further, in the case of the silicone compound (S2), for example, a method (dry treatment method) may be employed wherein the silicone oil is formed into a mist state and sprayed over the silica-covered titanium oxide particles, followed by drying at about 70° C.

In either case of the method (1) or the method (2), in order to further improve the dispersibility of the titanium oxide composite particles, metallic soap may be added together with the hydrophobizing agent. By addition of the metallic soap, heat generation by contact between a metal portion of e.g. a screw or a cylinder of an extruder to be used for formation of the fluororesin film and an oxide in the hydrophobizing agent will be suppressed, and the fluororesin film is hardly colored brown or black.

The metallic soap may, for example, be zinc salt, calcium salt or lithium salt of stearic acid.

The amount of addition of the metallic soap is preferably from 0.2 to 3 parts by mass, more preferably from 0.2 to 1 part by mass per 100 parts by mass of the silica-covered titanium oxide particles. When the amount of addition of the metallic soap is at least 0.2 part by mass, an effect of improving the dispersibility of the silica-covered titanium oxide particles by the metallic soap is likely to be obtained. Further, when the amount of addition of the metallic soap is at most 3 parts by mass, formation of "resin residue" (deposition of e.g. a low molecular weight product of the fluororesin on a die surface) at the time of film formation due to the metallic soap in excess is likely to be suppressed, and continuous formation will easily be carried out.

The method of kneading ETFE and the titanium oxide composite particles and as a case requires, the copper compound and the like, is not particularly limited, and a known method may be employed. For example, a method of blending predetermined amounts of ETFE, the titanium oxide composite particles and the like and kneading them by extrusion by a twin screw extruder may be employed.

To sufficiently disperse the titanium oxide composite particles in ETFE, kneading at a temperature of at least the melting point of ETFE is required, and the temperature at the time of kneading is preferably from 300 to 340° C.

Further, the method of forming the fluororesin film is also not particularly limited, and a known forming method may be employed. For example, a forming method of extruding a resin material kneaded by the above-described kneading method by an extruder having a T-die may be employed.

As a method of embossing the fluororesin film, for example, a method of carrying out film formation by making the molten fluororesin be supported on an embossing roll having sand carried on e.g. a silicon rubber may be mentioned. In this method, since the fluororesin extruded from a T-die extruder is rapidly stretched upon contact with the embossing roll, the fluororesin is likely to be oriented in the film surface layer.

With respect to the obtainable fluororesin film, Ra of the film surface to be in contact with the air when the film is used as a backsheet of a solar cell module can be adjusted by adjusting the particle size of the sand, the roll temperature, the air gap (the distance from the die outlet to the roll) and the resin temperature.

[Method of Use of Fluororesin Film]

The method of use of the fluororesin film of the present invention is a method of using a fluororesin film containing titanium oxide composite particles and having an arithmetic mean roughness Ra as stipulated by JIS B0601 of at least one film surface (the above-described film surface to be in contact with the air) of at most 3 µm, as described above, as an outermost layer of a backsheet of a solar cell module.

In the method of the present invention, the fluororesin film is used as an outermost film of a backsheet of a solar cell module so that the film surface (the above-described film surface to be in contact with the air) having an arithmetic mean roughness Ra as stipulated by JIS B0601 of at most 3 µm is in contact with the air, whereby formation of fine cracks on the film surface will be suppressed as described above, and development of the photoactivity of titanium oxide by the influence of water which infiltrates into the cracks can be prevented.

Now, a backsheet of a solar cell module using the fluororesin film of the present invention as an outermost layer will be described.

[Backsheet for Solar Cell Module]

Figure 2:
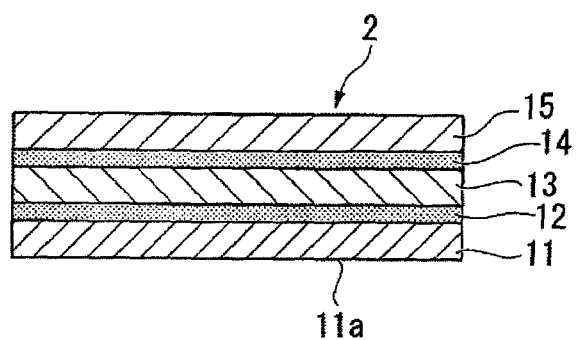
FIG. 2 is a cross sectional view illustrating another embodiment of the backsheet for a solar cell module of the present invention.

The backsheet for a solar cell module of the present invention (hereinafter simply referred to as a "backsheet") comprises a laminate having the above-described fluororesin film of the present invention as the outermost layer. Now, one embodiment of the backsheet of the present invention will be described in detail. FIG. 1 is a view illustrating a backsheet 1 according to a first embodiment, and FIG. 2 is a view illustrating a backsheet 2 according to a second embodiment.

First Embodiment

A backsheet 1 according to this embodiment comprises, as shown in FIG. 1, a laminate having a fluororesin film 11, an adhesive layer 12 and a moisture-proof layer 13 laminated in this order.

The fluororesin film 11 is an outermost layer of the backsheet 1 and is a layer in contact with the air on the rear side of a solar cell module. For the fluororesin film 11, the fluororesin film of the present invention is used. The surface 11a (the film surface to be in contact with the air) of the fluororesin film 11 is adjusted to have an arithmetic mean roughness Ra of at most 3 µm.

The shape of the fluororesin film 11 is not particularly limited and may property be selected in accordance with the shape of a solar cell module to be used.

The thickness of the fluororesin film 11 is preferably from 12 to 100 µm, more preferably from 20 to 50 µm. When the thickness of the fluororesin film 11 is at least 12 µm, formation of a hole on the fluororesin film 11 is likely to be suppressed, and an effect of protecting a solar cell element or a sealing resin such as EVA of a solar cell module tends to be sufficiently obtained. Further, when the thickness of the fluororesin film 11 is at most 100 µm, the production cost can be suppressed lower.

The adhesive layer 12 is a layer to bond the fluororesin film 11 and the moisture-proof layer 13.

As an adhesive to form the adhesive layer 12, an adhesive commonly used for a backsheet of a solar cell module can be used, and a two-pack type urethane adhesive comprising a main agent and a curing agent is preferred in view of excellent hydrolysis resistance.

The thickness of the adhesive layer 12 is preferably from 1 to 10 µm, more preferably from 2 to 5 µm. The thickness of the adhesive 12 is preferably thinner, however, if the thickness of the adhesive 12 is less than 1 µm, the adhesive strength between the fluororesin film 11 and the moisture-proof layer 13 may be insufficient, and when the thickness of the adhesive 12 is at least 1 µm, an adhesive strength of at least 3 N/cm will be obtained.

The moisture-proof layer 13 has a role to reduce the water vapor permeation of the backsheet 1 thereby to improve the moisture-proof property.

The moisture-proof layer 13 may, for example, be a metal foil such as an aluminum foil or a moisture-proof plastic such as moisture-proof polyethylene terephthalate.

The thickness of the moisture-proof layer 13 is preferably from 20 to 250 µm.

The moisture-proof layer hardly has a constitution having a moisture-proof effect alone, and has a constitution having electrical insulation performance in addition in many cases. Specifically, one comprising an aluminum foil having a thickness at a level of from several µm to 20 µm and having a PET film having a thickness at a level of from 25 to 150 µm laminated on one side or both sides of the aluminum foil, or one consisting solely of a plastic film such as a moisture-proof PET film having a thickness at a level of from 60 to 250 µm, which does not use a metal foil such as an aluminum foil, may, for example, be mentioned.

On the surface of the moisture-proof layer 13, a primer layer may be formed for the purpose of improving the adhesion to e.g. EVA which is a sealing resin for a solar cell element of a solar cell module. A primer agent to form the primer layer is preferably an acrylic polymer primer, a polyester primer or an ethylene/vinyl acetate copolymer.

As a method of producing the backsheet 1, a known method may be employed. For example, a method for producing the backsheet 1 by subjecting the surface of the fluororesin film 11 to treatment by corona discharge or plasma discharge, and then forming a laminate comprising the fluororesin film 11, the adhesive layer 12 and the moisture-proof layer 13 by a laminating method using an adhesive to form the adhesive layer 12, may be mentioned.

Second Embodiment

A backsheet 2 according to a second embodiment comprises, as shown in FIG. 2, a fluororesin film 11, an adhesive layer 12, a moisture-proof layer 13, an adhesive layer 14 and a fluororesin film 15 laminated in this order. The fluororesin film 11, the adhesive layer 12 and the moisture-proof layer 13 in the backsheet 2 are the same as those for the backsheet 1 according to the first embodiment, and their description is omitted.

The adhesive layer 14 is a layer to bond the moisture-proof layer 13 and the fluororesin film 15.

As an adhesive to form the adhesive layer 14, the same adhesive as mentioned for the adhesive layer 12 according to the first embodiment may be used. Further, the preferred thickness of the adhesive layer 14 is also the same as that of the adhesive layer 12.

The fluororesin film 15 has a role to further improve the effect of protecting a solar cell element or a sealing resin such as EVA of a solar cell module.

For the fluororesin film 15, the fluororesin film of the present invention may be used in the same manner as for the fluororesin film 11. Further, a known white or black fluororesin film using ETFE may also be used. Further, a known white or black fluororesin film comprising PVF or PVdF may also be used.

The thickness of the fluororesin film 15 is preferably from 12 to 100 µm, more preferably from 20 to 50 µm. When the thickness of the fluororesin film 15 is at least 12 µm, an effect of protecting a solar cell element or a sealing resin such as EVA of a solar cell module is likely to be obtained. Further, when the thickness of the fluororesin film 15 is at most 100 µm, the production cost can be suppressed lower.

On the surface of the fluororesin film 15, a primer layer may be formed for the purpose of improving the adhesion to e.g. EVA as a sealing resin of a solar cell element of a solar cell module, in the same manner as in the backsheet 1 according to the first embodiment.

As a method of producing the backsheet 2, a known method may be employed, and e.g. a production method utilizing a laminating method may be employed in the same manner as in the case of the backsheet 1.

The above-described backsheet of the present invention has the fluororesin film of the present invention as an outermost layer and thereby has excellent weather resistance. Therefore, the quality of a solar cell module can be maintained over a long period of time as compared with a conventional backsheet. Further, it can be suitably used as a backsheet of a solar cell module which is installed on the slant at an optimum angle depending on the latitude at the installation site.

The backsheet of the present invention is not limited to the backsheets as shown in FIGS. 1 and 2, and so long as it is a laminate employing the fluororesin film of the present invention as an outermost layer, various known constitutions may be employed for the constitutions other than the fluororesin film.

[Solar Cell Module]

The solar cell module of the present invention is a module provided with the above-described backsheet for a solar cell module, and is a module comprising a transparent substrate, a filler layer having a solar cell element sealed therein and the above-described backsheet having the fluororesin film as an outermost layer in this order, wherein the arithmetic mean roughness Ra of the film surface to be in contact with the air of the fluororesin film is at most 3 µm.

As a specific example, a solar cell module comprising the above-described backsheet 1 or backsheet 2 so that the film surface 11a will be in contact with the air may be mentioned.

As the transparent substrate, a substrate commonly used for a solar cell module may be used, and for example, a glass substrate may be mentioned. The transparent substrate preferably has a transmittance at a wavelength of from 400 nm to 1,000 nm of at least 90%.

Further, the shape of the transparent substrate is also not particularly limited and may property be selected depending on the purpose of use.

Further, the solar cell element is an element to convert the sunlight to electric energy, and a solar cell element commonly used for a solar cell module may be used.

Further, the filler layer to seal the solar cell element therein may be formed by a filler commonly used for a solar cell module. The filler may, for example, be EVA (ethylene/vinyl acetate copolymer).

With the above-described solar cell module of the present invention, since the arithmetic mean roughness Ra of the film surface to be in contact with the air of the fluororesin film as the outermost layer of the backsheet is at most 3 µm, formation of fine cracks on the film surface can be suppressed, and thus development of the photoactivity of titanium oxide in the fluororesin film by the influence of water which infiltrates into the cracks can be prevented. Therefore, since the solar cell module is protected by the backsheet having excellent heat resistance and weather resistance, it can be used stably over a long period of time.

EXAMPLES

Now, the present invention will be described in detail with reference to Examples and Comparative Examples. However, the present invention is not limited to the following specific Examples.

[Evaluation Method]

Methods for evaluating the silica-covered titanium oxide particles in Examples will be described below.

(Acid-Solubility)

0.2 g of a sample (silica-covered titanium oxide particles) is added to 10 ml of 98% sulfuric acid, and ultrasonic waves are applied for one minute for dispersion, followed by heating at 180° C. for one hour. Then, the sample is subjected to solid-liquid separation from sulfuric acid by a centrifugal separator, the amount of titanium oxide (as calculated as $TiO_2$) in sulfuric acid is measured by colorimetry, and the acid-solubility is calculated from the measured value in accordance with the following formula:

$$\text{Acid-solubility (\%)} = (\text{amount (g) of titanium oxide in sulfuric acid}/0.2\text{ (g)}) \times 100$$

(Karl Fischer Water Content)

A sample (silica-covered titanium oxide particles) was left at rest under constant temperature and constant humidity conditions at a temperature of 25° C. under a relative humidity of 55% for 24 hours to achieve an equilibrium state, and using 1 g of the sample, the Karl Fischer water contents at temperatures of 100° C. and 300° C. were measured by using a Karl Fischer water content measuring apparatus and a water vaporization apparatus attached thereto (each manufactured by Mitsubishi Chemical Corporation) to calculate the difference ($\Delta_{300-100}$).

(Arithmetic Mean Roughness Ra)

The arithmetic mean roughness Ra of a fluororesin film was measured in accordance with JIS B0601 using a contact surface roughness meter (manufactured by Kosaka Laboratory Ltd., SURFCORDER SE-30H).

Now, methods for evaluating the fluororesin film in Examples will be described below.

(Film Outer Appearance)

With respect to the film outer appearance, whether bubble streaks occurred or not was visually inspected based on the evaluation standards ○: no bubble streaks formed, and x: bubble streaks formed.

(Optical Properties)

The ultraviolet transmittance (%) at a wavelength of 360 nm as stipulated by JIS R3106 was measured by using UV-PC3300 measuring apparatus manufactured by Shimadzu Corporation. In a case where the fluororesin film of the present invention is used for a backsheet for a solar cell, considering protection of e.g. an adhesive, the ultraviolet transmittance at 360 nm is required to be less than 1%.

(Volume Resistivity)

With respect to the volume resistivity ($10^{13}$ Ω·cm) of the obtained fluororesin film, the volume resistivity after a voltage of 500 V was applied was measured by Digital Ultra-high Resistance/Micro Current Meter R8340 (manufactured by ADC Corporation). Further, the volume resistivities were measured in the same manner respectively after an accelerated weather resistance test (SWM (sunshine weather meter), 5,000 hours) and a heat resistant test at 230° C. for 168 hours were carried out. For the accelerated weather resistance test, an accelerated weather resistance test apparatus (manufactured by Suga Test Instruments Co., Ltd., Sunshine 300) was used, and as the exposure condition, the black panel temperature was 63° C.

With respect to the electrical insulation property, a high insulation performance by a thin fluororesin film at a level of 25 μm by itself is not necessarily required, but a film of which the volume resistivity changes by at least 10 times after the weather resistance test or the heat resistance test was considered not to be employed for a backsheet for a solar cell.

(Breaking Strength and Breaking Extension)

Using a gear oven with rotating specimen rack (GPHH-101 manufactured by ESPEC Corp.) as a measuring apparatus, one obtained by cutting the obtained fluororesin film into a size of 7 cm×15 cm was put, a dumbbell specimen was punched in a shape as defined in ASTM D638 TYPE V, and the breaking strength (MPa) and the breaking extension (%) in the lengthwise direction (MD direction) and the transverse direction (TD direction) were measured. The averages of values in the lengthwise direction and the transverse direction were regarded as the breaking strength and the breaking extension of the fluororesin film.

Further, in the same manner as the case of the volume resistivity, the breaking strength and the breaking extension after each of the accelerated weather resistance test (SWM, 5,000 hours) and the heat resistance test at 230° C. for 168 hours were carried out to calculate the retention (%) based on the value (initial value) before each test.

(4B Hardness Test)

On the mirror finish roll side of the obtained fluororesin film, a predetermined amount of an adhesive (AD76P1 manufactured by Toyo-Morton, Ltd.) was applied and dried, and a 150 μm PET film (tradename: Melinex, manufactured by Teijin DuPont Films Japan Limited) was bonded thereto. A load of 500 g was applied to the film surface by a hardness 4B pencil, and whether or not the film had scars was visually evaluated based on standards ○ (good): no scars observed and x (poor): scars observed. However, the result of the 4B hardness test being "○" is not necessarily required for the fluororesin film of the present invention.

Example 1

Rutile-form titanium oxide particles having an average particle size of 0.25 μm (CR50 manufactured by Ishihara Sangyo Kaisha, Ltd.) were mixed with water, and the pH was adjusted to 10 with sodium hydroxide to prepare an aqueous slurry having a concentration of titanium oxide of 250 g/l. While the aqueous slurry was maintained at 80° C. and stirred, sodium silicate in an amount of 2 parts by mass as calculated as $SiO_2$ per 100 parts by mass of the titanium oxide particles was added. Then, the aqueous slurry was neutralized to a pH of 5 by sulfuric acid over a period of 2 hours to form a dense silica cover layer thereby to obtain silica-covered titanium oxide particles. The obtained silica-covered titanium oxide particles were collected by filtration from the aqueous slurry, washed and dried at 120° C. for 16 hours. Then, agglomerates of the silica-covered titanium oxide particles were pulverized by a jet mill.

The acid-solubility of the silica-covered titanium oxide particles was evaluated and as a result, the acid-solubility was 25%. Further, the water content of the silica-covered titanium oxide particles was measured by a Karl Fischer method and as a result, the water content difference ($\Delta_{300-100}$) was 0.25%.

Then, the silica-covered titanium oxide particles were added in and mixed with dimethyl silicone oil (hydrophobizing agent, tradename: SH200, manufactured by Dow Corning Toray Co., Ltd.) dispersed in isopropyl alcohol (IPA) adjusted so that the amount of dimethyl silicone oil would be 2 parts by mass per 100 parts by mass of the silica-covered titanium oxide particles, followed by baking at 140° C. for 2 hours to obtain titanium oxide composite particles subjected to hydrophobization treatment.

5 kg of the above titanium oxide composite particles were blended and well mixed with 20 kg of Fluon C-88AX (ETFE resin, manufactured by Asahi Glass Company, Limited) as a fluororesin. Then, the mixture was extruded from a 35 mm co-rotating twin screw extruder (TEM35 manufactured by TOSHIBA MACHINE CO., LTD.) at a temperature of 320° C. in a discharge amount of 20 kg per hour to obtain a white master batch containing 20 mass % of the titanium oxide composite particles.

The white master batch was dried at 150° C. for one hour, and diluted with C-88AX and formed into a fluororesin film having a thickness of 25 μm so that the amount of the titanium oxide composite particles would be 8.3 mass %. As the extrusion conditions, a 30 mm single screw extruder having a 450 mm T-die attached to the tip was used as a forming machine, the film discharged from the T-die was passed between a mirror surface roll kept at 150° C. and a silicon embossing roll kept at 100° C. while being nipped to apply corona discharge on both surfaces. The arithmetic mean roughness Ra of the film surface was measured and as a result, Ra on the mirror surface roll side was 0.12 μm, and Ra on the embossing roll side was 1.32 μm.

Examples 2 and 3

A fluororesin film was formed in the same manner as in Example 1 except that the amount of the titanium oxide composite particles was 16.6 mass % (Example 2) or 20.0 mass % (Example 3).

Examples 4 and 5

A fluororesin film was formed in the same manner as in Example 1 except that the silica-covered titanium oxide particles were obtained by using sodium silicate in an amount of 1.5 parts by mass (Example 4) or 5 parts by mass (Example 5) as calculated as $SiO_2$ per 100 parts by mass of the titanium oxide particles.

Example 6

Titanium oxide composite particles were obtained in the same manner as in Example 1 except that to obtain the silica-covered titanium oxide particles, the aqueous slurry was neutralized to a pH of 5 by sulfuric acid over a period of 1.5 hours to form a silica cover layer, and that as the hydrophobizing agent, isobutyltrimethoxysilane in an amount of 7 parts by mass per 100 parts by mass of the obtained silica-covered titanium oxide particles was used.

Then, the titanium oxide composite particles were well mixed with C-88AX, the mixture was extruded and kneaded from a 35 mm co-rotating twin screw extruder (TEM35 manufactured by TOSHIBA MACHINE CO., LTD.) at a temperature of 320° C. in a discharge amount of 20 kg per hour, and then the same operation as in Example 1 was carried out to form a fluororesin film.

Example 7

A fluororesin film was formed in the same manner as in Example 1 except that no embossing by the mirror surface roll and the silicon embossing roll was carried out.

Example 8

A fluororesin film was formed in the same manner as in Example 1 except that when the white master batch was diluted, copper oxide was added in a content of 50 ppm.

Example 9

A fluororesin film was formed in the same manner as in Example 1 except that when the white master batch was diluted, copper iodide was added in a content of 30 ppm.

Comparative Example 1

A fluororesin film was formed in the same manner as in Example 1 except that no titanium oxide composite particles were used.

Comparative Examples 2 to 4

A fluororesin film was formed in the same manner as in Example 1 except that silica-covered titanium oxide particles were obtained by using sodium silicate in an amount of 1 part by mass (Comparative Example 2), 7 parts by mass (Comparative Example 3) or 10 parts by mass (Comparative Example 4) as calculated as $SiO_2$ per 100 parts by mass of the titanium oxide particles.

Comparative Example 5

A fluororesin film was formed in the same manner as in Example 1 except that to obtain the silica-covered titanium oxide particles, the aqueous slurry was neutralized to a pH of 5 by sulfuric acid over a period of 10 minutes to form a silica cover layer.

Comparative Example 6

Titanium oxide composite particles were obtained in the same manner as in Example 1 except that sodium silicate in an amount of 3 parts by mass as calculated as $SiO_2$ was used per 100 parts by mass of the titanium oxide particles, and that to obtain the silica-covered titanium oxide particles, the aqueous slurry was neutralized to a pH of 5 by sulfuric acid over a period of 0.5 hour to form a silica cover layer.

Further, the extrusion conditions were almost the same as those in Example 1, and the difference is that when a film was formed by the T-die method, the distance (so-called air gap) between the T-die and the nip (the contact point of the mirror surface roll and the silicon embossing roll) was reduced from 12 cm to 7 cm to carry out embossing in a shorter time during which the resin was cooled by the air.

Figure 3:
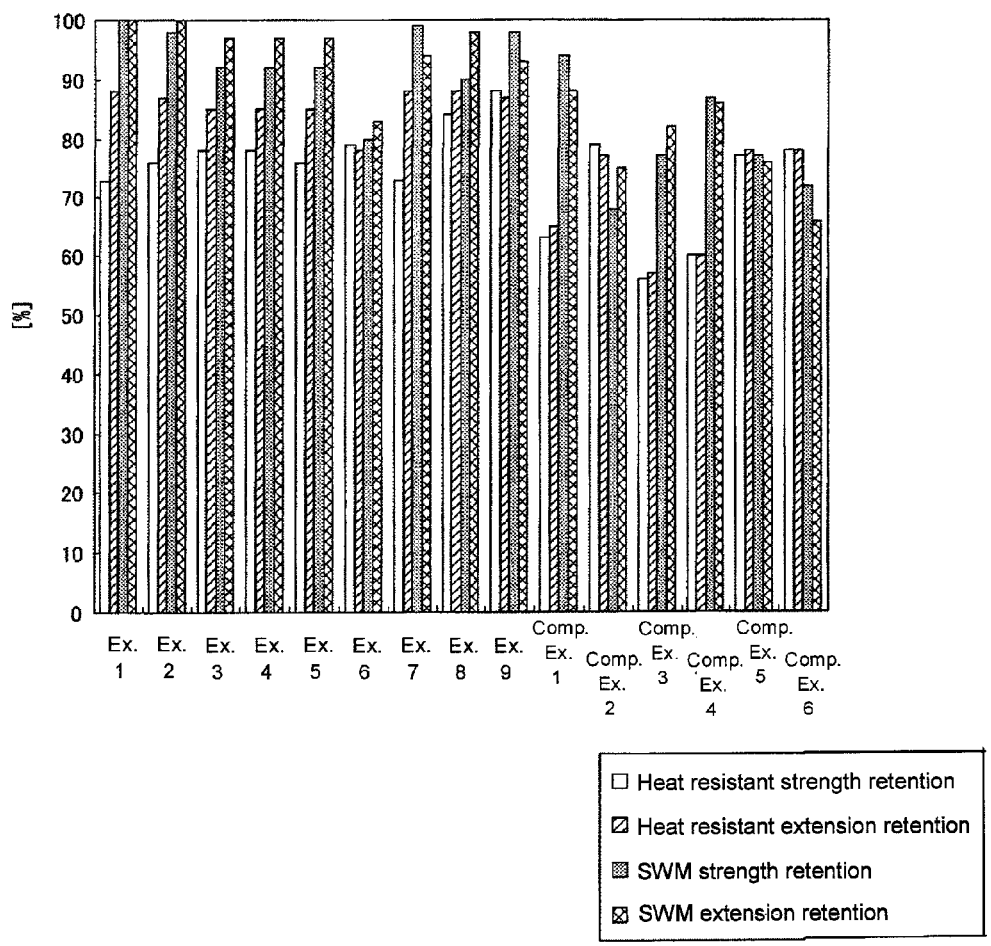
FIG. 3 is a graph illustrating the retentions of the breaking strength and the breaking extension of the fluororesin films in Examples after the weather resistance test and the heat resistance test.

Results of evaluating the silica-covered titanium oxide particles and the fluororesin films in Examples 1 to 9 and Comparative Examples 1 to 6 are shown in Table 1. In Table 1, "DMS" represents dimethyl silicone oil and "IBS" isobutyltrimethoxysilane. Further, the mass ratio of the silica cover layer in Table 1 is a value as calculated as $SiO_2$ per 100 parts by mass of the titanium oxide particles. Further, the "arithmetic mean roughness Ra [µm]" means a larger one of values of both sides of the film surface, and usually embossing is conducted to bring a larger Ra on the silicon embossing roll side rather than the mirror surface roll side. Further, the retentions of the breaking strength and the breaking extension of each fluororesin film after the weather resistance test and the heat resistance test are shown in FIG. 3.

TABLE 1

| | | | Ex. | | | | | | | | |
|---|---|---|---|---|---|---|---|---|---|---|---|
| | | | 1 | 2 | 3 | 4 | 5 | 6 | 7 | 8 | 9 |
| Titanium oxide composite particles | Silica-covered titanium oxide particles | Silica cover layer [parts by mass] | 2 | 2 | 2 | 1.5 | 5 | 2 | 2 | 2 | 2 |
| | | Water content difference ($\Delta_{300-100}$) [%] | 0.25 | 0.25 | 0.25 | 0.2 | 0.35 | 0.36 | 0.25 | 0.25 | 0.25 |
| | | Acid-solubility [%] | 25 | 25 | 25 | 27 | 37 | 42 | 25 | 25 | 25 |
| | Hydrophobizing agent [parts by mass] | DMS | 2 | 2 | 2 | 2 | 2 | — | 2 | 2 | 2 |
| | | IBS | — | — | — | — | — | 7 | — | — | — |
| | Content [mass %] | | 8.3 | 16.6 | 20 | 8.3 | 8.3 | 10 | 8.3 | 8.3 | 8.3 |

TABLE 1-continued

| | | | | | | | | | | | |
|---|---|---|---|---|---|---|---|---|---|---|---|
| Copper compound | | CuO [ppm] | — | — | — | — | — | — | — | 50 | — |
| | | CuI [ppm] | — | — | — | — | — | — | — | — | 30 |
| Fluororesin film | | Outer appearance | ○ | ○ | ○ | ○ | ○ | ○ | ○ | ○ | ○ |
| | | Arithmetic mean roughness Ra [μm] | 1.32 | 1.4 | 2.2 | 1.22 | 1.36 | 2.3 | 0.15 | 1.4 | 1.4 |
| | | 4B Hardness test | ○ | ○ | ○ | ○ | ○ | ○ | X | ○ | ○ |
| | Initial optical properties | 360 nm transmittance [%] | 0.04 | 0 | 0 | 0.04 | 0.04 | 0.01 | 0.01 | 0.03 | 0.03 |
| | Volume resistivity [$10^{13}$ Ω·cm] | Initial | 450 | 30 | 24 | 400 | 600 | 24 | 450 | 320 | 310 |
| | | After SWM: 5,000 H | 450 | 50 | 34 | 410 | 480 | 34 | 450 | 50 | 50 |
| | | After 230° C. × 168 H | 450 | 45 | 11 | 490 | 720 | 11 | 450 | 45 | 45 |
| | Breaking strength | Initial [MPa] | 65 | 63 | 65 | 65 | 65 | 58 | 65 | 62 | 52 |
| | | Retention [%] after SWM: 5,000 H | 100 | 98 | 92 | 92 | 92 | 80 | 99 | 90 | 98 |
| | | Retention [%] after 230° C. × 168 H | 73 | 76 | 78 | 78 | 76 | 79 | 73 | 84 | 88 |
| | Breaking extension | Initial [%] | 350 | 310 | 300 | 300 | 310 | 290 | 350 | 300 | 300 |
| | | Retention [%] after SWM: 5,000 H | 100 | 100 | 97 | 97 | 97 | 83 | 94 | 98 | 93 |
| | | Retention [%] after 230° C. × 168 H | 88 | 87 | 85 | 85 | 85 | 78 | 88 | 88 | 87 |

| | | | Comp. Ex. | | | | | |
|---|---|---|---|---|---|---|---|---|
| | | | 1 | 2 | 3 | 4 | 5 | 6 |
| Titanium oxide composite particles | Silica-covered titanium oxide particles | Silica cover layer [parts by mass] | — | 1 | 7 | 10 | 2 | 3 |
| | | Water content difference ($\Delta_{300-100}$) [%] | — | 0.1 | 0.68 | 1.22 | 0.55 | 0.4 |
| | | Acid-solubility [%] | — | 52 | 18 | 20 | 56 | 30 |
| | Hydrophobizing agent [parts by mass] | DMS | — | 2 | 2 | 2 | 2 | 2 |
| | | IBS | — | — | — | — | — | — |
| | | Content [mass %] | — | 8.3 | 8.3 | 8.3 | 8.3 | 8.3 |
| Copper compound | | CuO [ppm] | — | — | — | — | — | — |
| | | CuI [ppm] | — | — | — | — | — | — |
| Fluororesin film | | Outer appearance | ○ | ○ | X | X | X | ○ |
| | | Arithmetic mean roughness Ra [μm] | 2.2 | 2.2 | 1.6 | 1.7 | 1.7 | 3.2 |
| | | 4B Hardness test | X | ○ | ○ | ○ | ○ | ○ |
| | Initial optical properties | 360 nm transmittance [%] | 87 | 0.01 | 0.12 | 0.28 | 0.22 | 0.01 |
| | Volume resistivity [$10^{13}$ Ω·cm] | Initial | 160 | 32 | 2 | 32 | 62 | 25 |
| | | After SWM: 5,000 H | 160 | 33 | 5 | 33 | 43 | 35 |
| | | After 230° C. × 168 H | 200 | 23 | 10 | 23 | 53 | 11 |
| | Breaking strength | Initial [MPa] | 64 | 66 | 61 | 56 | 62 | 58 |
| | | Retention [%] after SWM: 5,000 H | 94 | 68 | 77 | 87 | 77 | 72 |
| | | Retention [%] after 230° C. × 168 H | 63 | 79 | 56 | 50 | 77 | 78 |
| | Breaking extension | Initial [%] | 340 | 290 | 310 | 260 | 300 | 220 |
| | | Retention [%] after SWM: 5,000 H | 88 | 75 | 82 | 86 | 76 | 66 |
| | | Retention [%] after 230° C. × 168 H | 65 | 77 | 57 | 60 | 78 | 78 |

As shown in Table 1 and FIG. 3, the fluororesin films in Examples 1 to 9 which contain titanium oxide composite particles of the present invention have the breaking strength and the breaking extension after the weather resistance test equal to or higher than those in Comparative Example 1 wherein no titanium oxide composite particles are contained. Further, they had excellent breaking strength and breaking elongation after the heat resistance test and had excellent weather resistance. Further, fluororesin films in Examples 8 and 9 which contain a copper compound had a higher effect of improving the breaking strength retention as compared with Examples 1 to 3. Further, no bubble streaks were formed on the film surface, and excellent film outer appearance was obtained.

The fluororesin films in Examples 1 to 9 had an ultraviolet transmittance at a wavelength of 360 nm of at most 0.1% and had a property to sufficiently protect an adhesive and a moisture-proof plastic sheet of a backsheet. Further, all the films had a volume resistivity of at least $1×10^{13}$ Ω·cm and had a sufficient electrical insulation property, and each of these values was not significantly changed by the accelerated weather resistance test or the heat resistance test.

On the other hand, the fluororesin film in Comparative Example 2 wherein the mass ratio of the silica cover layer in the titanium oxide composite particles is low, had low breaking strength and breaking extension after the weather resistance test as compared with Comparative Example 1 wherein no titanium oxide composite particles were added, and no sufficient weather resistance was obtained.

Further, with respect to the fluororesin films in Comparative Examples 3 and 4 wherein the mass ratio of the silica cover layer in the titanium oxide composite particles is high, the water content difference ($\Delta_{300-100}$) of the silica-covered titanium oxide particles is large, and the breaking strength and the breaking extension after the heat resistance test are low. In addition, bubble streaks were formed on the film surface, and the film was poor in the outer appearance. Further, on the fluororesin film in Comparative Example 5 wherein the water content difference ($\Delta_{300-100}$) of the silica-covered titanium oxide particles when the titanium oxide composite particles were to be obtained is 0.55%, bubble streaks were formed on the film surface and the film was poor in the outer appearance.

The fluororesin film in Comparative Example 6 wherein the arithmetic mean roughness Ra of the film surface was 3.2 μm had low breaking strength and breaking extension after the weather resistance test and was poor in the weather resistance even though titanium oxide composite particles covered with a sufficient amount of silica and wherein the water content difference ($\Delta_{300-100}$) of the silica-covered titanium oxide particles was 0.4% were used. This is considered to be because Ra of the film surface is too large, whereby fine cracks were formed on the film during the weather resistance test, titanium oxide composite particles exposed to the crack portion were influenced by the water, and the photoactivity of titanium oxide was developed.

INDUSTRIAL APPLICABILITY

No bubble streaks are formed on the fluororesin film of the present invention even when it contains a sufficient amount of titanium oxide. Further, deterioration of the fluororesin can be suppressed. The fluororesin film of the present invention is excellent in electrical insulation property and weather resistance, and the water vapor permeation through the film is small, and accordingly the fluororesin film of the present invention can be suitably used for a backsheet in a solar cell module installed on the slant at an optimum angle depending on the latitude at the installation site.

The entire disclosure of Japanese Patent Application No. 2008-312736 filed on Dec. 8, 2008 including specification, claims, drawings and summary is incorporated herein by reference in its entirety.

REFERENCE SYMBOLS 1,2: Backsheet, 11: fluororesin film, 11a: film surface, 12: adhesive layer, 13: moisture-proof layer, 14: adhesive layer, 15: fluororesin film

What is claimed is:

1. A fluororesin film comprising:
an ethylene/tetrafluoroethylene copolymer as the main component, and
titanium oxide composite particles,
wherein:
each titanium oxide composite particle comprises (i) a silica-covered titanium oxide particle and (ii) a hydrophobizing agent covering the silica-covered titanium oxide particle;
the surface of the fluororesin film in contact with air has an arithmetic mean roughness Ra, as stipulated by JIS B0601, of from 0.5 to 3 μm;
the silica-covered titanium oxide particles comprise from 1.5 to 5 parts by mass of silica, calculated as $SiO_2$, per 100 parts by mass of the titanium oxide particles;
the silica-covered titanium oxide particles have a difference ($\Delta_{300-100}$) in the Karl Fischer water content between 300° C. and 100° C. of at most 0.5%;
the titanium oxide composite particles comprise from 0.5 to 10 parts by mass of the hydrophobizing agent per 100 parts by mass of the silica-covered titanium oxide particles;
the fluororesin film has a thickness of from 12 to 100 μm;
the fluororesin film has an initial breaking strength of 52 to 65 MPa; and
the fluororesin film has an initial breaking extension of 290 to 350%.

2. The fluororesin film of claim 1, comprising from 6 to 25 mass % of the titanium oxide composite particles.

3. The fluororesin film of claim 1, wherein the average particle size of the titanium oxide composite particles is from 0.1 to 0.4 μm.

4. The fluororesin film of claim 1, wherein the acid-solubility of the titanium oxide composite particles is from 15 to 50%.

5. The fluororesin film of claim 1, wherein the hydrophobizing agent is a silane coupling agent (S1) having an alkyl group or a silicone compound (S2).

6. The fluororesin film of claim 1, wherein the arithmetic mean roughness Ra is from 0.5 to 2.5 μm.

7. The fluororesin film of claim 1, further comprising a copper compound in an amount of from 1 to 500 ppm.

8. The fluororesin film of claim 1, wherein the resin of the film comprises the ethylene/tetrafluoroethylene copolymer in an amount of at least 90 mass %.

9. The fluororesin film of claim 1, wherein the resin of the film comprises the ethylene/tetrafluoroethylene copolymer in an amount of at least 98 mass %.

10. The fluororesin film of claim 1, wherein the resin of the film consists of the ethylene/tetrafluoroethylene copolymer.

11. The fluororesin film of claim 1, wherein the ethylene/tetrafluoroethylene copolymer comprises repeating units based on tetrafluoroethylene and based on ethylene, in a molar ratio within a range of 20/80 to 80/20.

12. The fluororesin film of claim 1, wherein the ethylene/tetrafluoroethylene copolymer comprises repeating units based on tetrafluoroethylene and based on ethylene, in a molar ratio within a range of 30/70 to 70/30.

13. The fluororesin film of claim 1, wherein the ethylene/tetrafluoroethylene copolymer comprises repeating units based on tetrafluoroethylene and based on ethylene, in a molar ratio within a range of 40/60 to 60/40.

14. The fluororesin film of claim 1, wherein the ethylene/tetrafluoroethylene copolymer has a number average molecular weight of 100,000 to 500,000.

15. The fluororesin film of claim 1, wherein the ethylene/tetrafluoroethylene copolymer has a number average molecular weight of 200,000 to 400,000.

16. The fluororesin film of claim 1, wherein the acid-solubility of the silica-covered titanium oxide particles is from 15 to 30%.

17. The fluororesin film of claim 1, further comprising a copper compound in an amount of from 5 to 500 ppm.

18. A laminate comprising the fluororesin film of claim 1, an adhesive layer, and a moisture-proof layer laminated together in this order.

19. A laminate comprising a first fluororesin film of claim 1, a first adhesive layer, a moisture-proof layer, a second adhesive layer, and a second fluororesin film of claim 1 laminated together in this order.

20. A backsheet for a solar cell module, which comprises a laminate having the fluororesin film of claim 1 as the outermost layer.

21. A solar cell module, which comprises a transparent substrate, a filler layer having a solar cell element sealed therein and the backsheet of claim 20 in this order.

* * * * *